(12) United States Patent
Maeda et al.

(10) Patent No.: US 6,187,090 B1
(45) Date of Patent: Feb. 13, 2001

(54) METHODS AND A DEVICE FOR MEASURING MELT SURFACE TEMPERATURE WITHIN APPARATUS FOR PULLING A SINGLE CRYSTAL

(75) Inventors: Tokuji Maeda, Saga; Keiichi Takanashi, Hyogo, both of (JP)

(73) Assignee: Sumitomo Metal Industries, Ltd., Osaka (JP)

( * ) Notice: Under 35 U.S.C. 154(b), the term of this patent shall be extended for 0 days.

(21) Appl. No.: 09/220,685

(22) Filed: Dec. 23, 1998

(30) Foreign Application Priority Data

Dec. 26, 1997 (JP) .................................................. 9-358899

(51) Int. Cl.[7] .................................................. C30B 15/22
(52) U.S. Cl. .................................. 117/14; 117/15; 117/20; 117/202
(58) Field of Search .................................. 117/14, 15, 20, 117/202

(56) References Cited

U.S. PATENT DOCUMENTS 5,665,159 * 9/1997 Fuerhoff .............................. 117/201
5,961,716 * 10/1999 White et al. .......................... 117/14

* cited by examiner

Primary Examiner—Felisa Hiteshew
(74) Attorney, Agent, or Firm—Wenderoth, Lind & Ponack, L.L.P.

(57) ABSTRACT

In a conventional method, it is difficult to reject a stray light component with certainty, so that it is difficult to accurately measure the temperature of the melt surface. Since a temperature measuring device and a computing means are expensive, the cost of the measurement tends to be high. Modifications to an existing apparatus for pulling a single crystal are required, which is an inconvenience. In order to solve the above problems, a CCD camera is used for detecting the radiation light luminance distribution of the melt surface, the minimum radiation light luminance $L_{min}$ is determined based on the radiation light luminance distribution data measured using the CCD camera, and the temperature $T_S$ of the melt surface within an apparatus for pulling a single crystal is computed based on the minimum radiation light luminance $L_{min}$.

10 Claims, 10 Drawing Sheets

METHODS AND A DEVICE FOR MEASURING MELT SURFACE TEMPERATURE WITHIN APPARATUS FOR PULLING A SINGLE CRYSTAL

BACKGROUND OF THE INVENTION

1. Field of the Invention

The present invention relates to methods and a device for measuring the temperature of the melt surface within an apparatus for pulling a single crystal and, more particularly, to methods for measuring the temperature of the melt surface within an apparatus for pulling a single crystal wherein non-contact temperature measurement is performed and a device is used for the methods.

2. Description of the Relevant Art

Keeping the temperature of the melt surface in optimum condition during single crystal growth is needed in order to ensure the quality of the single crystal. As a precondition, it is required that the temperature of the melt surface be accurately measured. A dip-type thermocouple, a non-contact radiation thermometer, and the like have been used for measuring the temperature of the melt surface. However, in a temperature measuring method wherein the thermocouple is used, the thermocouple easily wears and has a short life span, or constituents of the thermocouple contaminate the melt, resulting in a bad influence upon the quality of a single crystal to be pulled. Therefore, it is difficult to continuously measure the temperature of the melt surface for a long period of time.

In order to cope with the problem, recently a method wherein non-contact temperature measurement of the melt surface is performed using the radiation thermometer has been frequently used. The temperature measuring method wherein the radiation thermometer is used is based on the luminance of a thermal radiation light radiated from an object of measurement being determined from the temperature and the emissivity of the object of measurement. The temperature is obtained based on the luminance of the thermal radiation light measured by non-contact measurement and the emissivity obtained on a different occasion. Therefore, in the temperature measuring method wherein the radiation thermometer is used, there is no probability that impurities will contaminate a melt. The temperature of the melt surface can be continuously measured during the pulling of a single crystal.

Figure 1:
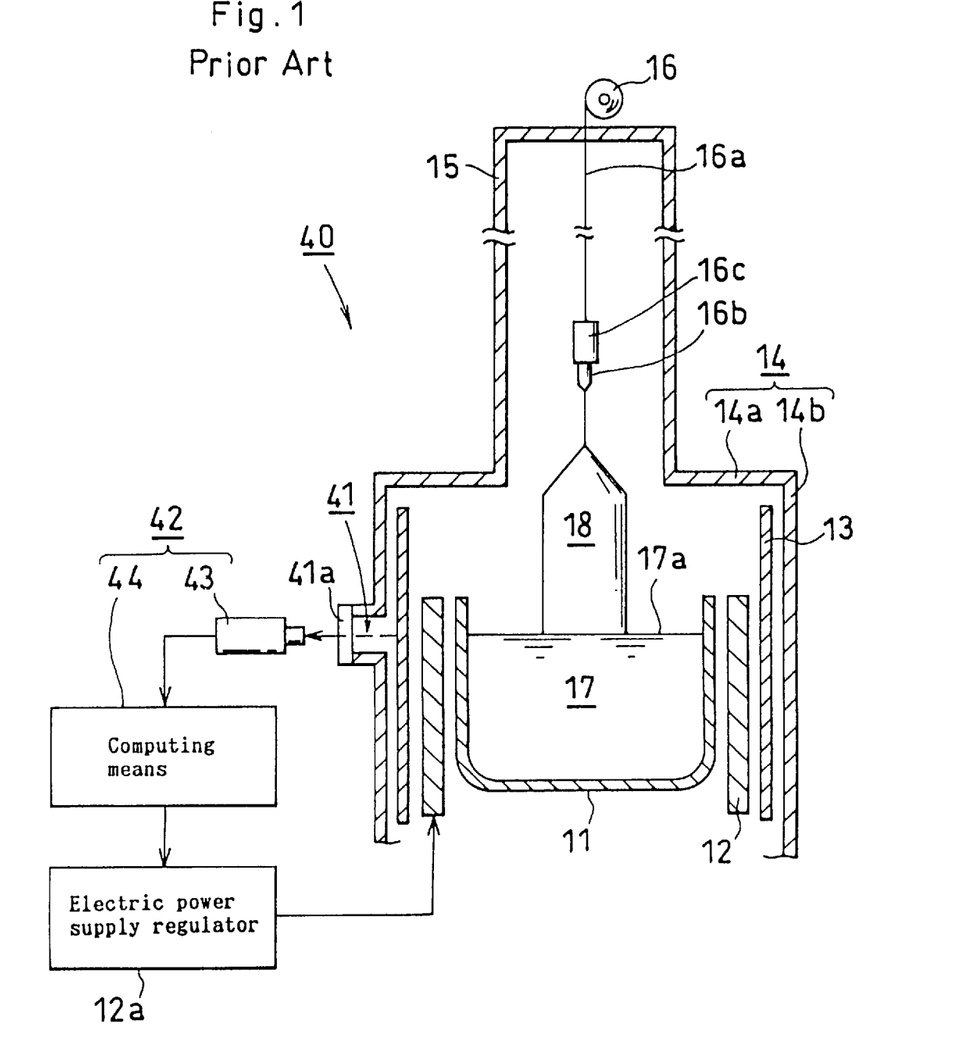
FIG. 1 is a diagrammatic sectional view showing an apparatus for pulling a single crystal incorporating a conventional temperature measuring device wherein a radiation thermometer is used.

FIG. 1 is a diagrammatic sectional view showing an apparatus 40 for pulling a single crystal incorporating a conventional temperature measuring device 42 wherein a radiation thermometer is used, and reference numeral 11 in the figure represents a crucible. The crucible 11 is cylindrical, and is supported with an ascent/descent means (not shown) by which the crucible 11 is moved up and down while being rotated. The vertical position of the crucible 11 can be adjusted by driving the ascent/descent means. An almost cylindrical heater 12 is arranged around the crucible 11 and an electric power supply regulator 12a is connected thereto. An almost cylindrical heat insulating mold 13 is arranged around the heater 12, and a lower chamber's wall 14 is arranged around the heat insulating mold 13 so as to surround the heat insulating mold 13. An upper chamber's wall 15 stands on a lower chamber's upper wall 14a having the shape of a ring.

Inside the upper chamber's wall 15, a pulling shaft 16a is suspended. A seed crystal 16b is held by a holder 16c at the lower end of the pulling shaft 16a, which is wound while being rotated by a driving means 16. A window 41 is formed in a vertical position on a lower chamber's side wall 14b where the melt surface 17a is located, and is sealed with a quartz glass member 41a or the like.

The crucible 11 is charged with a melt 17 of melted polycrystal silicon (Si) or the like. By bringing the seed crystal 16b into contact with the melt surface 17a and pulling the pulling axis 16a while rotating it, a single crystal 18 can be grown from the melt surface 17a.

On the other hand, a radiation thermometer 43 is placed outside the window 41 in the almost horizontal direction, and is connected to a computing means 44 which is further connected to the electric power supply regulator 12a. The non-contact temperature measuring device 42 includes the radiation thermometer 43 and the computing means 44. The luminance of a thermal radiation light radiated from the heat insulating mold 13 in the vicinity of the melt surface 17a is measured using the radiation thermometer 43. The temperature is computed and detected based on the measured luminance of the thermal radiation light in the computing means 44. In the electric power supply regulator 12a, the quantity of electric power supplied to the heater 12 is regulated based on the computed and detected temperature so as to keep the melt surface 17a at a prescribed temperature. As a result, the melt surface 17a is kept at a prescribed temperature.

However, in the temperature measurement using the above temperature measuring device 42, the temperature of the heat insulating mold 13 and that of the melt surface 17a have not been the same, as the diameter of the seed crystal 18 and the apparatus for pulling a single crystal 40 have been larger in order to manufacture an LSI more efficiently. As a result, it has been difficult to accurately measure the temperature of the melt surface 17a. Since the heat capacity of the melt 17 is relatively large, there is a difference in temperature between the melt 17 in the vicinity of the crucible 11 close to the heater 12 and the melt 17 in the vicinity of the single crystal 18 away from the heater 12. As a result, it is difficult to accurately measure the required temperature of the melt surface 17a in the vicinity of the single crystal 18. Since convection is caused in the melt 17 by the difference in temperature, the temperature of the melt surface 17a easily varies with time. As a result, it is difficult to accurately measure the temperature of the melt surface 17a following the variations.

In order to cope with the above problems, it is desirable that the temperature of the melt surface 17a in the vicinity of the single crystal 18 be directly measured using the radiation thermometer. Radiation lights having radiants such as the upper portion of the side wall of the crucible 11, the heater 12, the heat insulating mold 13, and the lower chamber's upper wall 14a, which surround the melt surface 17a and are hot, provide a specular reflection on the melt surface 17a. Therefore, even when the temperature of the melt surface 17a in the vicinity of the single crystal 18 is directly measured using the radiation thermometer, the radiation lights caused by specular reflection (hereinafter, referred to as the stray lights) are incident on the radiation thermometer, in addition to the thermal radiation light from the melt surface 17a itself, so that an error in the measured temperature is easily caused.

In order to reduce the influence of the stray light and improve the measurement precision, various kinds of temperature measuring devices were proposed.

Figure 2:
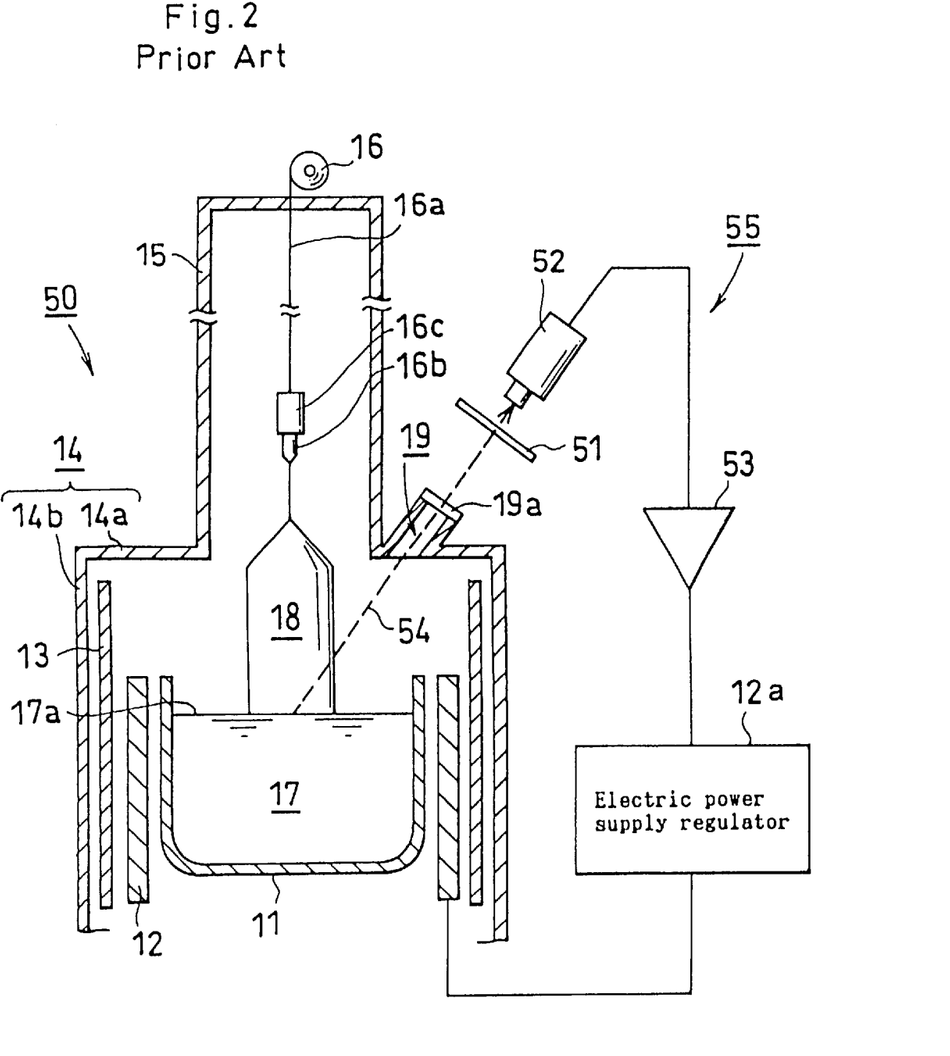
FIG. 2 is a diagrammatic sectional view showing an apparatus for pulling a single crystal incorporating another conventional temperature measuring device.

FIG. 2 is a diagrammatic sectional view showing an apparatus 50 for pulling a single crystal incorporating a conventional temperature measuring device 55 (Japanese Kokai No. 58-168927), and reference numeral 14a represents a lower chamber's upper wall. A window 19 facing the melt surface 17a in the vicinity of a single crystal 18 is formed at a prescribed place on the lower chamber's upper wall 14a, and is sealed with a quartz glass member 19a or the like.

On the other hand, a polarizing filter 51 and an optical detecting means (silicon electromotive force device) 52 are arranged above the window 19 in a slanting direction on the axis 54 of a radiation light. The optical detecting means 52 is connected through an amplifier 53 to an electric power supply regulator 12a. The temperature measuring device 55 includes the polarizing filter 51, the optical detecting means 52, and the amplifier 53.

In the temperature measuring device 55 having the above construction, a stray light component is rejected by separating to measure a component $S_1$ polarized in parallel to the melt surface 17a and a component $S_2$ polarized vertically (neither of them shown) and performing a computation of $(S_1+S_2) -\alpha(S_1-S_2)$. Here, $\alpha$ is a function related to a measurement wavelength region, an angle of reflection, and the like. Practically, the value is experientially selected.

Since the other constituents are almost the same as those of the apparatus for pulling a single crystal 40 shown in FIG. 1, detailed descriptions thereof are omitted here.

Figure 3:
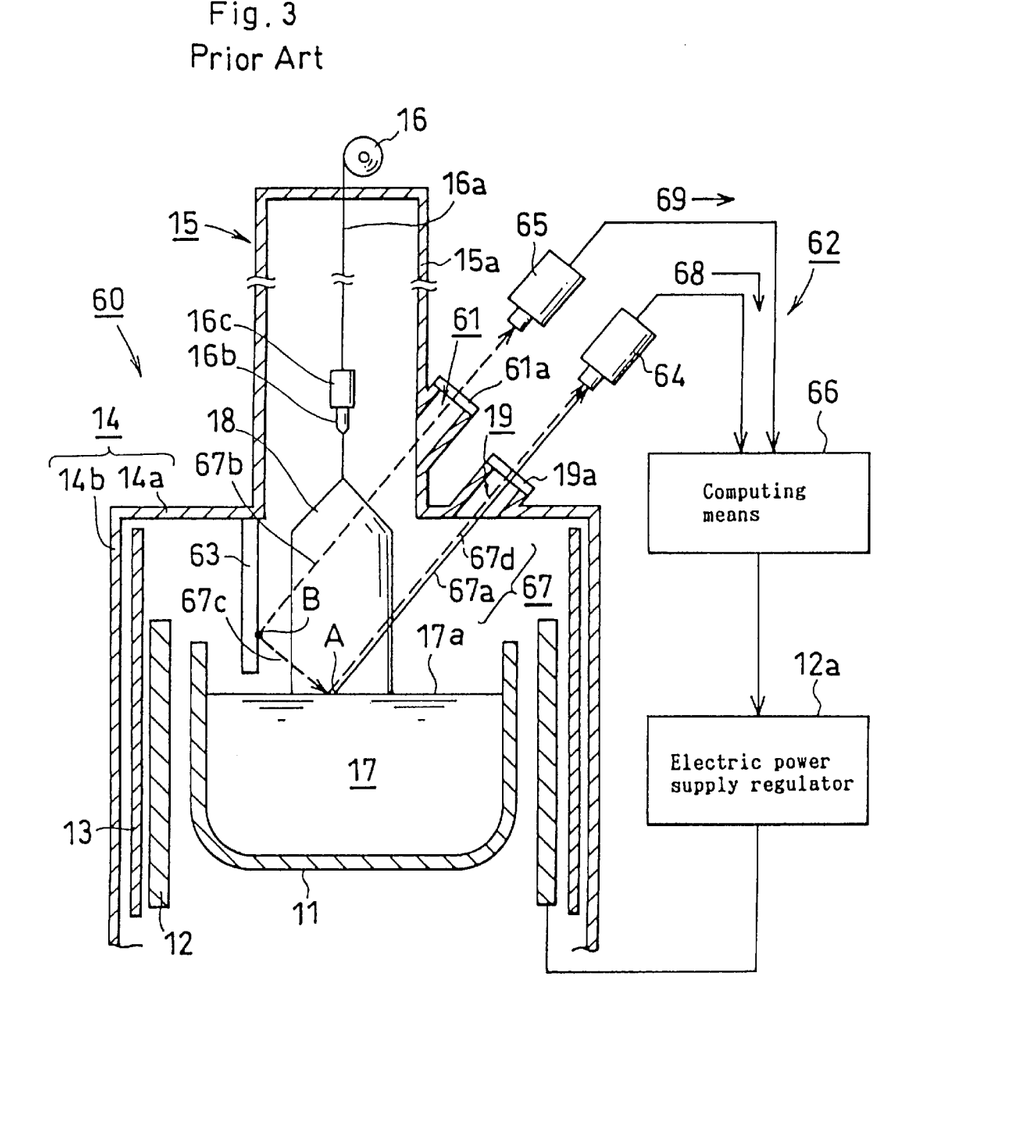
FIG. 3 is a diagrammatic sectional view showing an apparatus for pulling a single crystal incorporating still another conventional temperature measuring device.

FIG. 3 is a diagrammatic sectional view showing an apparatus 60 for pulling a single crystal incorporating a temperature measuring device 62 which was previously proposed by the present inventors (Japanese Kokai No. 06-129911), and reference numeral 15 in the figure represents an upper chamber's wall. A window 61 facing downward in a slanting direction is formed at a prescribed place on the side wall 15a of the upper chamber's wall 15, and is sealed with a quartz glass member 61a or the like.

A temperature measuring auxiliary plate 63 is held at a prescribed place on the inner surface of the lower chamber's upper wall 14a. The temperature measuring auxiliary plate 63 is made of a graphite material or the like whose emissivity is known and has low angle-dependence. On the other hand, a radiation thermometer 64 and a dichroic radiation thermometer 65 are arranged above the windows 19 and 61 in a slanting direction, respectively. The radiation thermometer 64 is placed on the axis of a thermal radiation light 67a radiated from a measurement point A on the melt surface 17a, while the dichroic radiation thermometer 65 is placed on the axis of a radiation light 67b radiated from a radiant B on the temperature measuring auxiliary plate 63. The mounting positions and angles of the temperature measuring auxiliary plate 63, the radiation thermometer 64, and the dichroic radiation thermometer 65 are selected respectively so that the radiation light 67c radiated from the radiant B is reflected from the measurement point A and that the reflected light (stray light) 67d is incident on the radiation thermometer 64 in conjunction with the thermal radiation light 67a. The radiation thermometer 64 and the dichroic radiation thermometer 65 are connected to a computing means 66 which is connected to an electric power supply regulator 12a. The temperature measuring device 62 includes the temperature measuring auxiliary plate 63, the radiation thermometer 64, the dichroic radiation thermometer 65, and the computing means 66.

In the temperature measuring device 62 having the above construction, the luminance of a radiation light 67 which is the reflected light 67d integrated with the thermal radiation light 67a radiated from the measurement point A is measured using the radiation thermometer 64, and the luminance signal 68 is transmitted to the computing means 66. At the same time, the temperature signal 69 of the radiant B measured using the dichroic radiation thermometer 65 is transmitted to the computing means 66. In the computing means 66, the luminance of the radiation light 67b radiated from the radiant B is computed with the data of the temperature signal 69, and the luminance of the radiation light 67b is subtracted from that of the radiation light 67 to obtain that of the thermal radiation light 67a. The temperature of the measurement point A on the melt surface 17a is detected by computation with the luminance data of the thermal radiation light 67a.

Since the other constituents are almost the same as those of the apparatus for pulling a single crystal 50 shown in FIG. 2, detailed descriptions thereof are omitted here.

Figure 4:
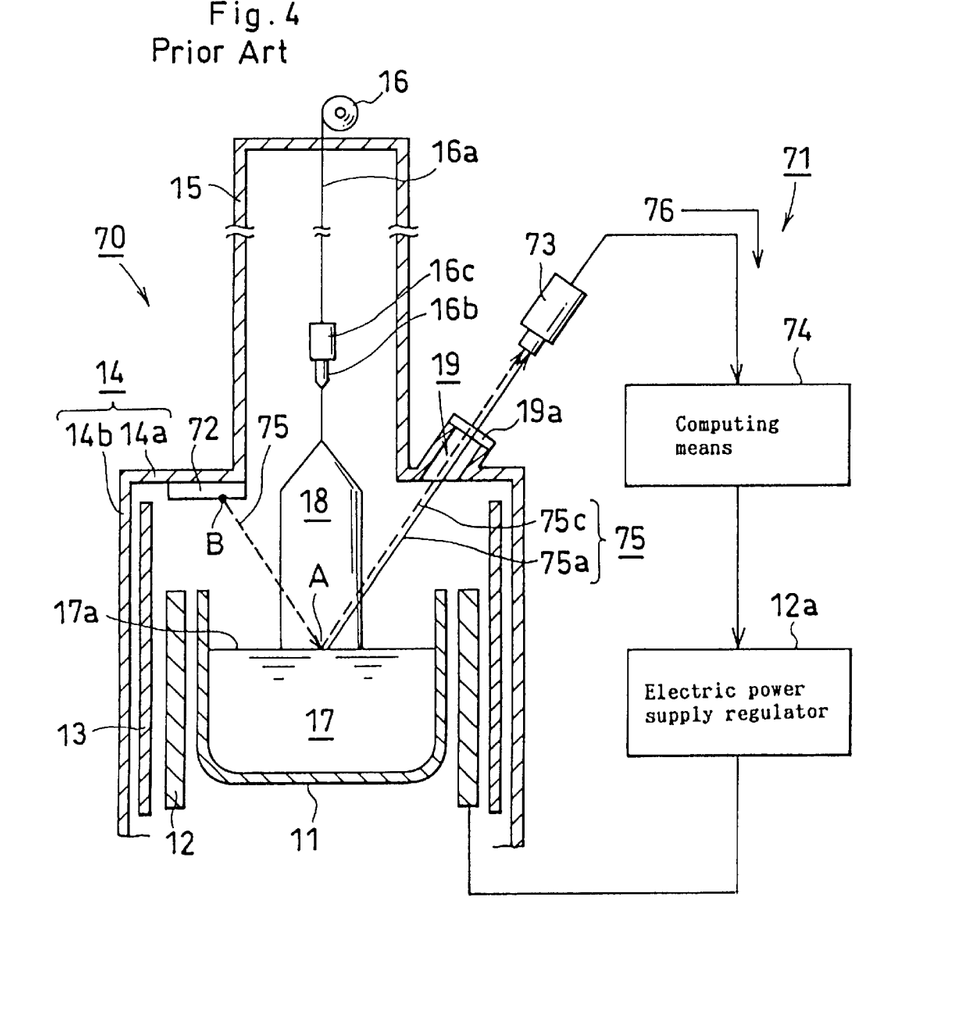
FIG. 4 is a diagrammatic sectional view showing an apparatus for pulling a single crystal incorporating still another conventional temperature measuring device.

FIG. 4 is a diagrammatic sectional view showing an apparatus for pulling a single crystal 70 incorporating a temperature measuring device 71 which was previously proposed by the present inventors (Japanese Kokai No. 08-74979), and reference numeral 14a in the figure represents a lower chamber's upper wall. A stray light rejecting plate 72 is held at a prescribed place on the under surface of the lower chamber's upper wall 14a. The stray light rejecting plate 72 is made of a graphite material or the like, which has a relatively low emissivity and does not easily contaminate a melt 17 as an impurity. A cooling means (not shown) is mounted near the mounting place of the stray light rejecting plate 72 on the lower chamber's upper wall 14a. By operating the cooling means, the temperature of the stray light rejecting plate 72 is kept at a prescribed temperature or below at all times.

On the other hand, a radiation thermometer 73 is arranged above a window 19 in a slanting direction, and is placed on the axis of a thermal radiation light 75a radiated from a measurement point A on the melt surface 17a. The mounting positions and angles of the stray light rejecting plate 72 and the radiation thermometer 73 are respectively selected so that a radiation light 75b radiated from a radiant B on the stray light rejecting plate 72 is reflected from the measurement point A and so that the reflected light (stray light) 75c is incident on the radiation thermometer 73 in conjunction with the thermal radiation light 75a. The radiation thermometer 73 is connected to a computing means 74 which is connected to an electric power supply regulator 12a. The temperature measuring device 71 includes the stray light rejecting plate 72, the radiation thermometer 73, and the computing means 74.

In the temperature measuring device 71 having the above construction, the luminance of the radiation light 75 which is the reflected light 75c integrated with the thermal radiation light 75a radiated from the measurement point A, is measured using the radiation thermometer 73, and the luminance signal 76 is transmitted to the computing means 74. At that time, by cooling the radiant B beforehand to a prescribed temperature (e.g. 800° C. when the melt 17 is Si) or below, the luminance of the reflected light 75c becomes so small that it can be neglected. Therefore, even if the luminance of the radiation light 75 is used for a computation in the computing means 74, a quite accurate temperature of the measurement point A on the melt surface 17a can be obtained.

Since the other constituents are almost the same as those of the apparatus 50 for pulling a single crystal shown in FIG. 2, detailed descriptions thereof are omitted here.

In the temperature measuring device 55 shown in FIG. 2. a function $\alpha$ is experientially selected, so that it is difficult to certainly reject a stray light component to accurately measure the temperature of the melt surface 17a.

In the temperature measuring device 62 shown in FIG. 3, both of the radiation thermometer 64 and the dichroic radiation thermometer 65 are required for an apparatus for pulling a single crystal 60, leading to a high cost.

In the temperature measuring device 71 shown in FIG. 4, the cooling means need be mounted on the lower chamber's upper wall 14a. An existing apparatus for pulling a single crystal would need to be extensively modified, which is an inconvenience.

SUMMARY OF THE INVENTION

The present invention was developed in order to solve the above problems, and it is an object of the present invention to provide methods for measuring the temperature of the melt surface within an apparatus for pulling a single crystal and a device used for the methods. In the methods, an existing apparatus for pulling a single crystal is used as it is without the necessity of making modifications thereon. The temperature of the melt surface can be accurately measured at low cost normally using one temperature measuring means.

The below symbols are defined as follows.

L: Luminance of a radiation light radiated from the melt surface toward the outside of a crucible $L_b(T)$: Luminance of a radiation light on a black body having a temperature of T $L_n'$: Luminance of a stray light n: Number of times of reflection of a stray light on a chamber's wall $T_S$: Temperature of the melt surface $T_H$: Temperature of a radiant of a stray light (chamber's wall)

$\epsilon_s$: Emissivity of the melt surface (a decimal below 1)

$\epsilon_c$: Emissivity of the chamber's wall (a decimal below 1)

$\tau_w$: Transmittance of a quartz glass member (a decimal below 1)

Figure 5:
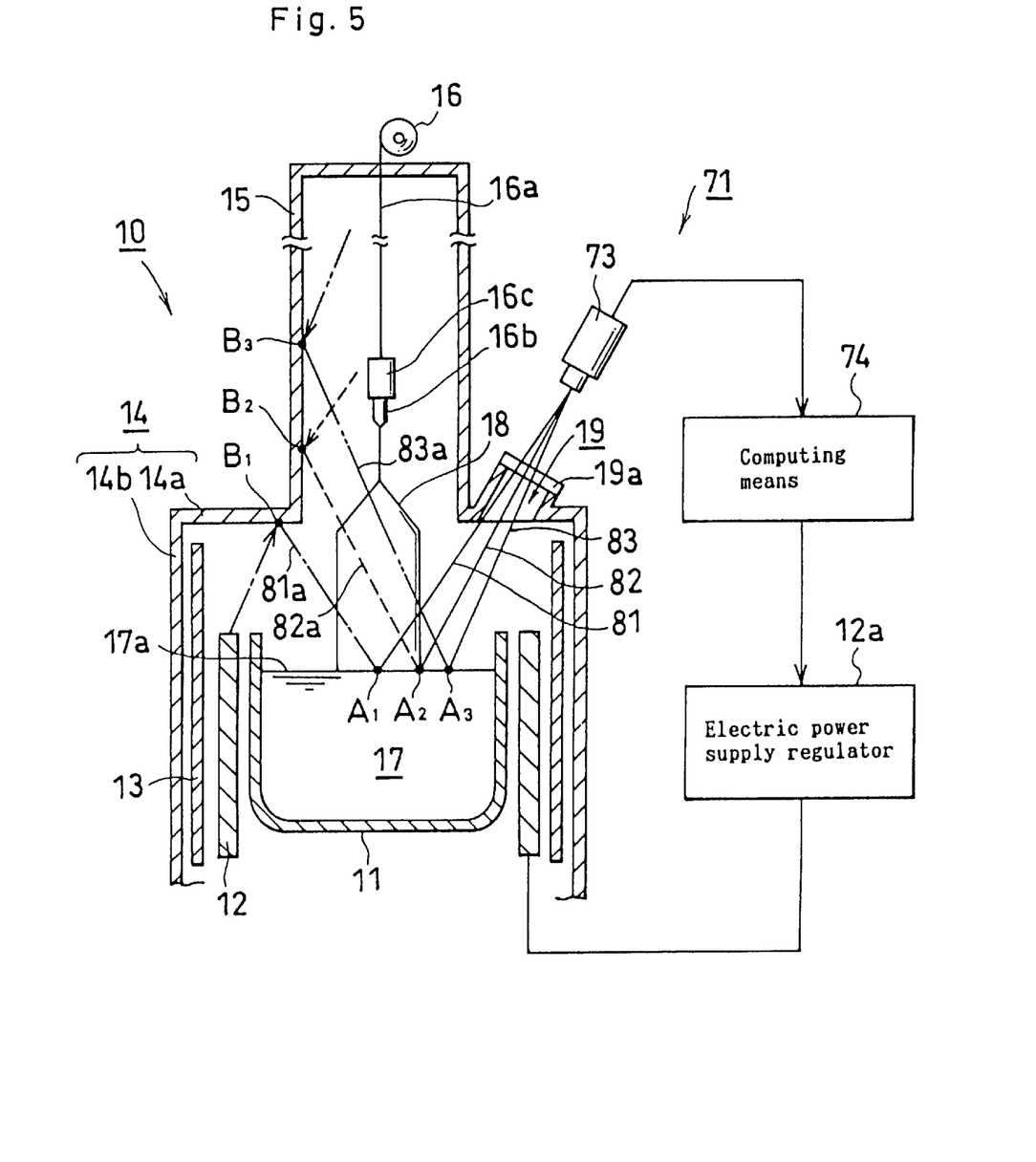
FIG. 5 is a diagrammatic sectional view showing an apparatus for pulling a single crystal in order to describe the function of a temperature measuring device according to the present invention.

FIG. 5 is a diagrammatic sectional view showing an apparatus 10 for pulling a single crystal in order to describe a temperature measuring method of the melt surface according to the present invention. The parts thereof except a temperature measuring device are the same as those of an apparatus 50 for pulling a single crystal shown in FIG. 2. A radiation thermometer 73 shown in FIG. 4 or the like is arranged above a quartz glass member 19a in a slanting direction. The axis of incident light of the radiation thermometer 73 can be set at any time in the direction of measurement points $A_1$–$A_3$ or the like on the melt surface 17a.

In this case, each luminance L of radiation lights 81–83 radiated outward from the measurement points $A_1$–$A_3$ through a window 19 is obtained by Formula 1.

$$L=\tau_w\{\epsilon_s L_b(T_S)+(1-\epsilon_s)L'\} \quad \text{Formula 1}$$

The first term of the Formula 1 $\tau_w \cdot \epsilon_s \cdot L_b(T_S)$ is a component of a thermal radiation light radiated from the measurement points $A_1$–$A_3$ on the melt surface 17a, while the second term $\tau_w \cdot (1-\epsilon_s)L'$ is a component of a stray light which is radiated from reflection points $B_1$–$B_3$ and is reflected on the measurement points $A_1$–$A_3$ on the melt surface 17a.

On the other hand, the luminance $L_1'$ of a stray light 81a, which is radiated from a heater 12 or the like whose temperature $T_H$ is higher than that of the melt surface 17a and is once reflected on the reflection point $B_1$, is obtained by Formula 2.

$$L_1'=(1-\epsilon_c)L_b(T_H) \quad \text{Formula 2}$$

In this case, since the luminance $L_1'$ of the stray light 81a is large (bright), it is not desired that the luminance $L_1'$ of the stray light 81a be neglected. Neglecting it causes an error in the detected temperature.

On the other hand, the luminance $L_n'$ of a stray light 82a or 83a, which is radiated from the heater 12, a crucible 11, or the like, is (n−1) times reflected on chamber's walls 14 and 15, and has the n th reflection on the reflection point $B_2$ or $B_3$, is obtained by Formula 3.

$$L_n'=(1-\epsilon_c)^n L_b(T_H) \quad \text{Formula 3}$$

In this case, since the luminance $L_n'$ of the stray light 82a or 83a is attenuated to be small (dark) as the number of times of reflection n increases, the luminance $L_n'$ of the stray light 82a or 83a can be neglected. Even if it is neglected, error is not often to caused by the detected temperature.

For example, where the emissivity $\epsilon_c$ of the upper chamber's wall 15 is 0.5, the luminance $L_{n=3}'$ of a stray light 82a, whose number of times of reflection n on the upper chamber's wall 15 is 3, decreases to about a quarter of the luminance of a stray light 81a whose number of times of reflection n is 1.

Figure 6:
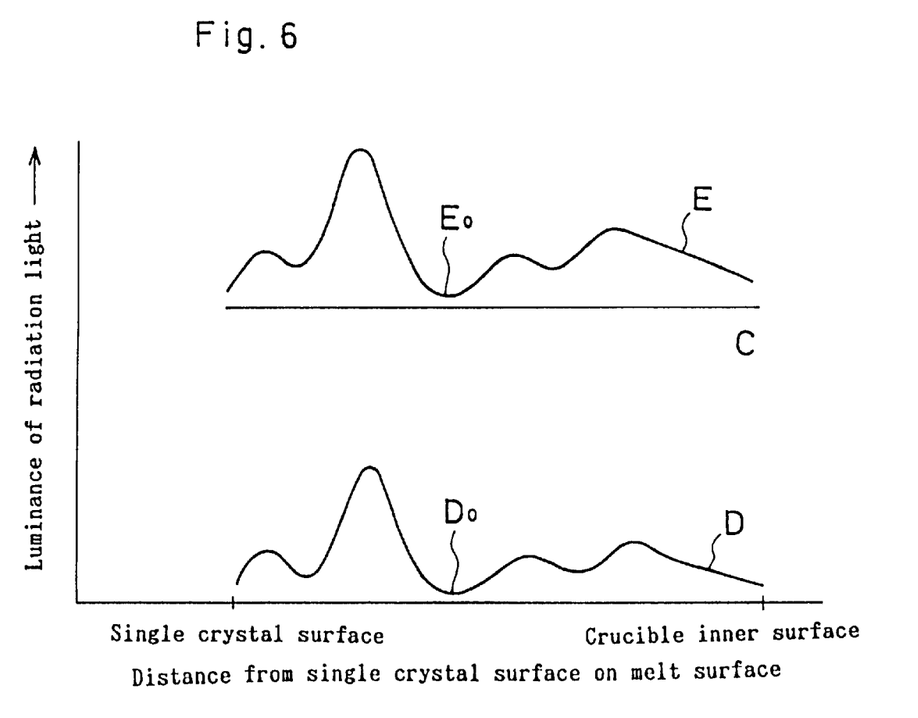
FIG. 6 comprises curves schematically showing the relationship shown by Formulas 1–3.

FIG. 6 comprises curves schematically showing the relationship of the Formulas 1–3. In the figure, C, D, and E represent the luminances of radiation lights from the melt surface 17a, those of stray lights, and the measured luminances of radiation lights, respectively. The luminances C of the radiation lights from the melt surface 17a are almost uniform at any measurement point on the melt surface 17a. On the other hand, the luminances D of the stray lights are different, depending on the measurement points on the melt surface 17a, and the luminance $L_n'$ becomes a minimum value $D_o$ at the point where the number of times of reflection n is maximum. Since the relationship E=C+D holds, the temperature of the melt surface 17a can be calculated with a minimum error by obtaining the minimum reading $E_o$ from the measured luminances E of the radiation lights.

The present inventors studied a method for measuring the temperature of the melt surface within an apparatus for pulling a single crystal and found that the temperature of the melt surface 17a can be obtained accurately and easily by measuring the smallest luminance L on the melt surface 17a and calculating the temperature based on the luminance L, leading to the completion of the present invention.

The method for measuring the temperature of the melt surface within an apparatus for pulling a single crystal (1) according to the present invention is characterized by measuring the luminance distribution of radiation lights radiated from the melt surface within an apparatus for pulling a single crystal using a temperature distribution measuring means, computing and detecting a point having a minimum radiation light luminance using a computing means with the radiation light luminance distribution data, and measuring the surface temperature at the point using a radiation temperature measuring means.

In the method for measuring the temperature of the melt surface within an apparatus for pulling a single crystal (1), after the point on which a stray light component has the smallest influence is computed and detected using the temperature distribution measuring means and the computing means, the surface temperature at the point can be accurately measured using relatively cheap radiation temperature measuring means. Even when plural apparatuses for pulling a single crystal are installed, only one unit of the temperature distribution measuring means and the computing means need be prepared. The radiation temperature measuring means is relatively cheap, a modifications and additional equipment to the main unit of the apparatus for pulling a single crystal are not needed at all. As a result, the cost can be largely reduced.

The method for measuring the temperature of the melt surface within an apparatus for pulling a single crystal (2) according to the present invention is characterized by using a monochromatic radiation thermometer as the radiation temperature measuring means in the method for measuring the temperature of the melt surface (1).

In the method for measuring the temperature of the melt surface within an apparatus for pulling a single crystal (2), since the cheap monochromatic radiation thermometer is used as the radiation temperature measuring means, the cost can be reduced.

The method for measuring the temperature of the melt surface within an apparatus for pulling a single crystal (3) according to the present invention is characterized by measuring the luminance distribution of radiation lights radiated from the melt surface within an apparatus for pulling a single crystal using a temperature distribution measuring means, and obtaining the surface temperature at a point having a minimum radiation light luminance as computing and detecting the point of the minimum luminance, using a computing means with the radiation light luminance distribution data.

In the method for measuring the temperature of the melt surface within an apparatus for pulling a single crystal (3), even if the operation conditions substantially vary during the pulling of a single crystal, a point on which a stray light component has the smallest influence can be accurately found using the temperature distribution measuring means and the computing means, and the surface temperature at the point can be accurately measured at all times. Since modifications and additional equipment to the main unit of the apparatus for pulling a single crystal are not needed at all, an increase in cost is not caused.

The method for measuring the temperature of the melt surface within an apparatus for pulling a single crystal (4) according to the present invention is characterized by using a CCD camera as the temperature distribution measuring means in one of the methods for measuring the temperature of the melt surface (1)–(3).

In the method for measuring the temperature of the melt surface within an apparatus for pulling a single crystal (4), since the CCD camera is used as the temperature distribution measuring means, the surface temperature distribution can be accurately measured by a relatively simple operation.

The method for measuring the temperature of the melt surface within an apparatus for pulling a single crystal (5) according to the present invention is characterized by using a thermal image measuring device as the temperature distribution measuring means in one of the methods for measuring the temperature of the melt surface (1)–(3).

In the method for measuring the temperature of the melt surface within an apparatus for pulling a single crystal (5), since the thermal image measuring device is used as the temperature distribution measuring means, the surface temperature distribution and the surface temperature can be more accurately measured.

The temperature measuring device of the melt surface within an apparatus for pulling a single crystal (1) according to the present invention is characterized by having a temperature distribution measuring means by which the radiation light luminance distribution on the melt surface is detected, and a computing means by which the minimum radiation light luminance is determined based on the radiation light luminance distribution data measured using the temperature distribution measuring means and the temperature is computed based on the minimum radiation light luminance.

The temperature measuring device of the melt surface within an apparatus for pulling a single crystal (1) need not be used in combination with another radiation thermometer and the operation thereof is extremely simple. As a result, the measurement precision can certainly be improved.

BRIEF DESCRIPTION OF THE DRAWINGS

FIG. 9(a) shows the first process thereof and FIG. 9(b) shows the second process thereof.

DETAILED DESCRIPTION OF THE PREFERRED EMBODIMENTS

The preferred embodiments of the methods of measuring the temperature of the melt surface within an apparatus for pulling a single crystal and the device used in the methods according to the present invention are described below by reference to the Figures of the drawings. Here, the same marks are affixed to the components that have the same functions as those of a conventional apparatus.

Figure 7:
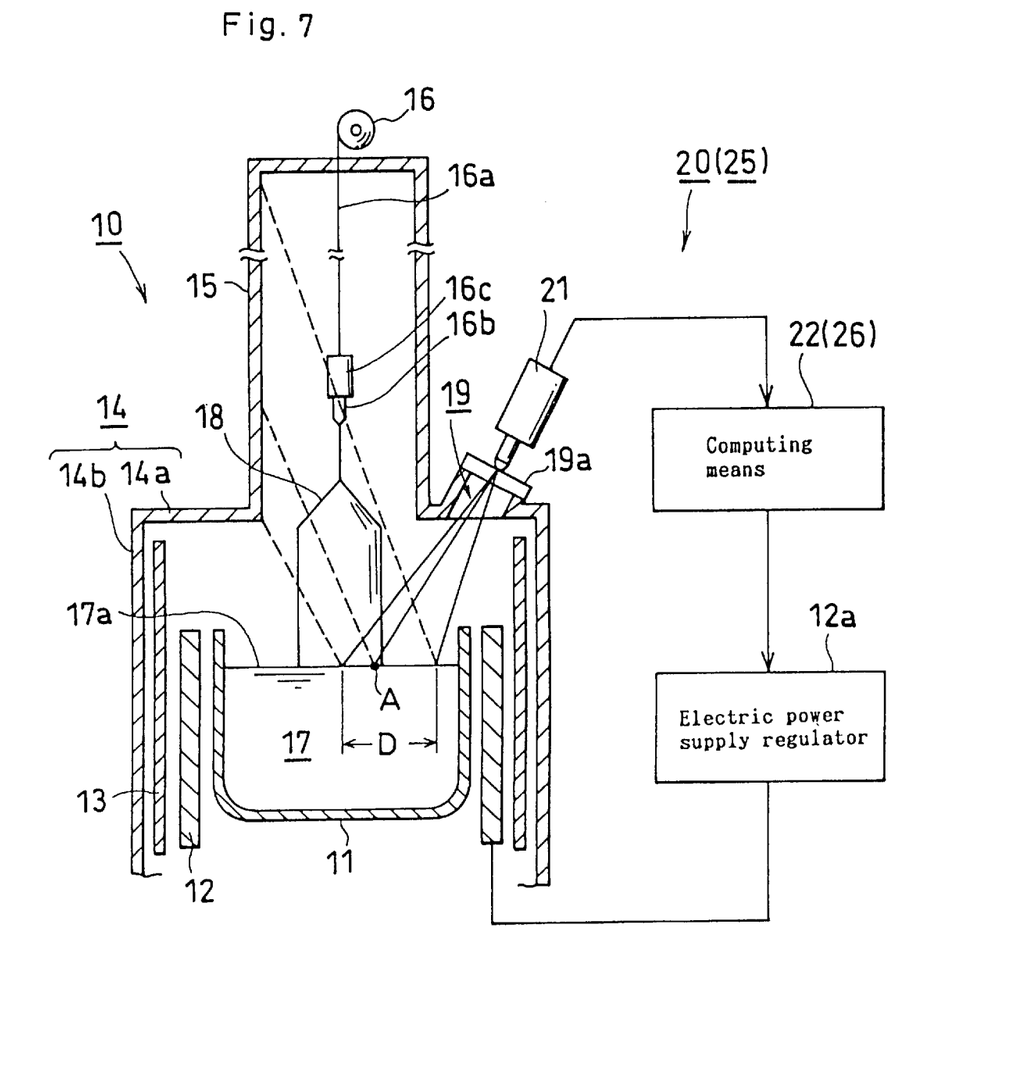
FIG. 7 is a diagrammatic sectional view showing a device used in a method for measuring the temperature of the melt surface within an apparatus for pulling a single crystal (the first process) according to Embodiment (1) of the present invention, and a device used in a method of measuring the temperature of the melt surface within an apparatus for pulling a single crystal according to Embodiment (2)

FIG. 7 is a diagrammatic sectional view showing an apparatus for pulling a single crystal 10 which is used in the first process of a method for measuring the temperature of the melt surface within an apparatus for pulling a single crystal according to Embodiment (1), and reference numeral 11 in the figure represents a crucible. The crucible 11 is cylindrical, and is supported with an ascent/descent means (not shown) by which the crucible 11 is moved up and down while being rotated. The vertical position of the crucible 11 can be adjusted by driving the ascent/descent means. An almost cylindrical heater 12 is arranged around the crucible 11, and an electric power supply regulator 12a is connected thereto. An almost cylindrical heat insulating mold 13 is arranged around the heater 12, and a lower chamber's wall 14 is arranged around the heat insulating mold 13 so as to surround the heat insulating mold 13. An upper chamber's wall 15 stands on a lower chamber's upper wall 14a having the shape of a ring.

Inside the upper chamber's wall 15, a pulling axis 16a is suspended. A seed crystal 16b is held by a holder 16c at the lower end of the pulling axis 16a, which is wound while being rotated by a driving means 16. A window 19 facing the melt surface 17a is formed at a prescribed place on the lower chamber's upper wall 14a, and is sealed with a quartz glass member 19a or the like.

The crucible 11 is charged with a melt 17 of melted polycrystal silicon (Si) or the like. By bringing and the seed crystal 16b into contact with the melt surface 17a and pulling the pulling axis 16a while rotating it, a single crystal 18 can be grown from the melt surface 17a.

On the other hand, a CCD camera 21 is placed above the window 19 in a slanting direction as a temperature distribution measuring means. The mounting angle of the CCD camera 21 is selected so that a part of the upper chamber's wall 15 reflected by the melt surface 17a comes within the visual field D thereof. The CCD camera 21 is connected to a computing means 22. A temperature measuring device 20 includes the CCD camera 21 and the computing means 22. The computing means 22 is further connected to the electric power supply regulator 12a, wherein the quantity of electric power supplied to the heater 12 is regulated based on the computed temperature so as to keep the melt surface 17a at a prescribed temperature.

Figure 9:
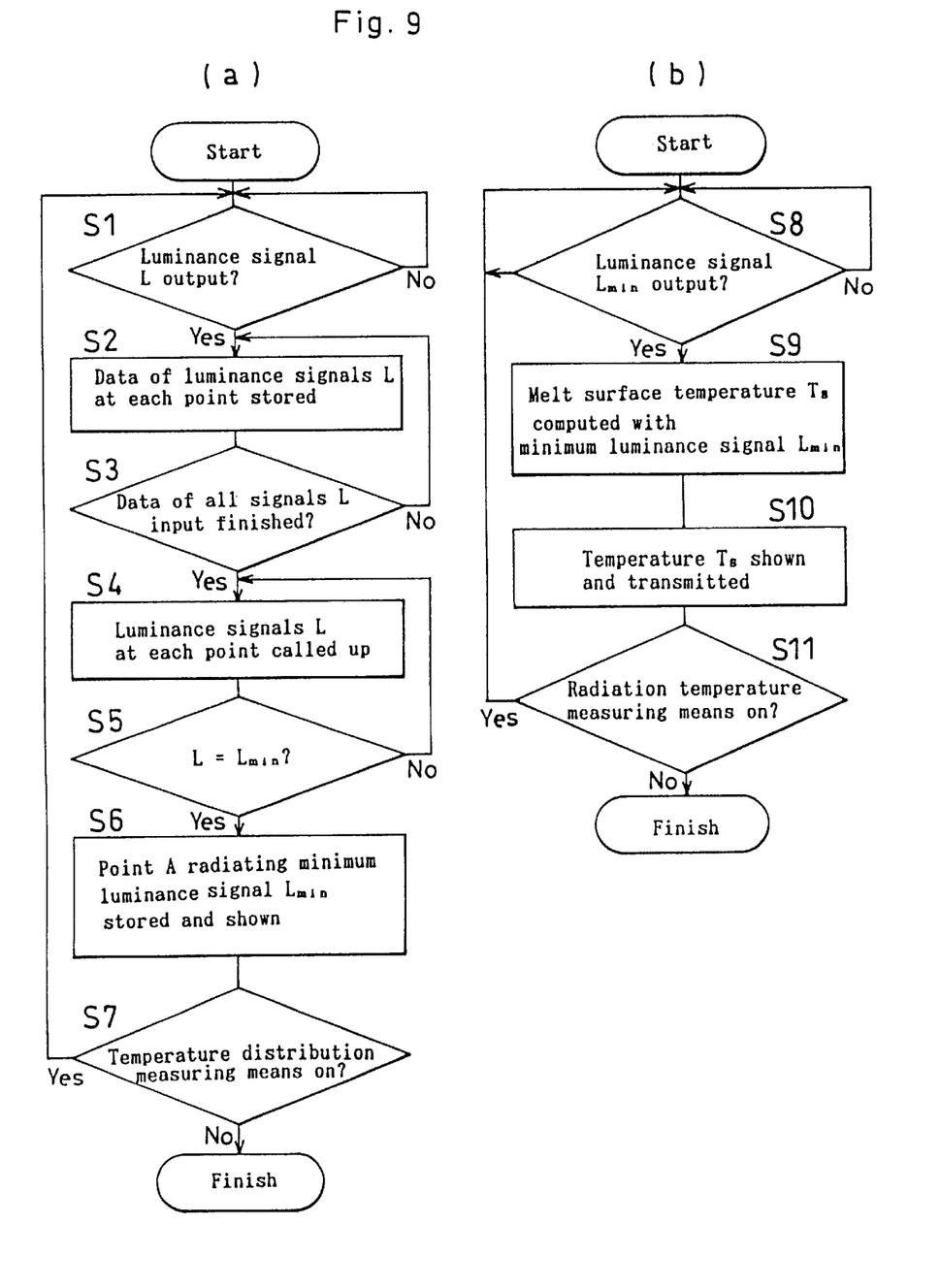
FIG. 9 comprises flow charts schematically expressing the operation of a temperature measuring device of the melt surface within an apparatus for pulling a single crystal according to the Embodiment (1)

FIG. 9(a) is a flow chart schematically expressing the operation of the computing means 22 in the temperature measuring device 20.

The switch (not shown) of the temperature measuring device 20 is turned on to start the operation. In the step (hereinafter, referred to as S) 1, a determination is made as to whether a radiation light luminance signal L is output from the CCD camera 21 or not. A determination that it is not yet output leads to a return to S1. On the other hand, if a determination that the output has started is made, data of radiation light luminance signals L at each of plural points (radiation light luminance L distribution data) within the visual field D is captured and is stored in a memory (not shown) of the computing means 22 (S2).

In S3, a determination is made as to whether all the data of the radiation light luminance signals L at each of the plural points is captured and is stored or not is made. A determination that the data is not yet perfect leads to a return to S2. On the other hand, if a determination is made that all the data is captured and is stored, the stored radiation light luminance signals L at each point are called up (S4), and the minimum radiation light luminance signal $L_{min}$ is extracted from the radiation light luminance signals L in S5.

The point A which radiates the minimum radiation light luminance signal $L_{min}$ is stored in the memory and a command to show it on a display (not shown) or the like is output (S6). In S7, a determination as to whether the switch of the CCD camera 21 is on or not is made. A determination that the switch is on leads to a return to S1, and the radiation point A of the radiation light luminance signal $L_{min}$ is confirmed again. On the other hand, if a determination is made that the switch is not on, the operation of the computing means 22 is finished.

Then, the temperature measuring device 20 is taken off, leading to the completion of the first process of the method of measuring the temperature of the melt surface.

Figure 8:
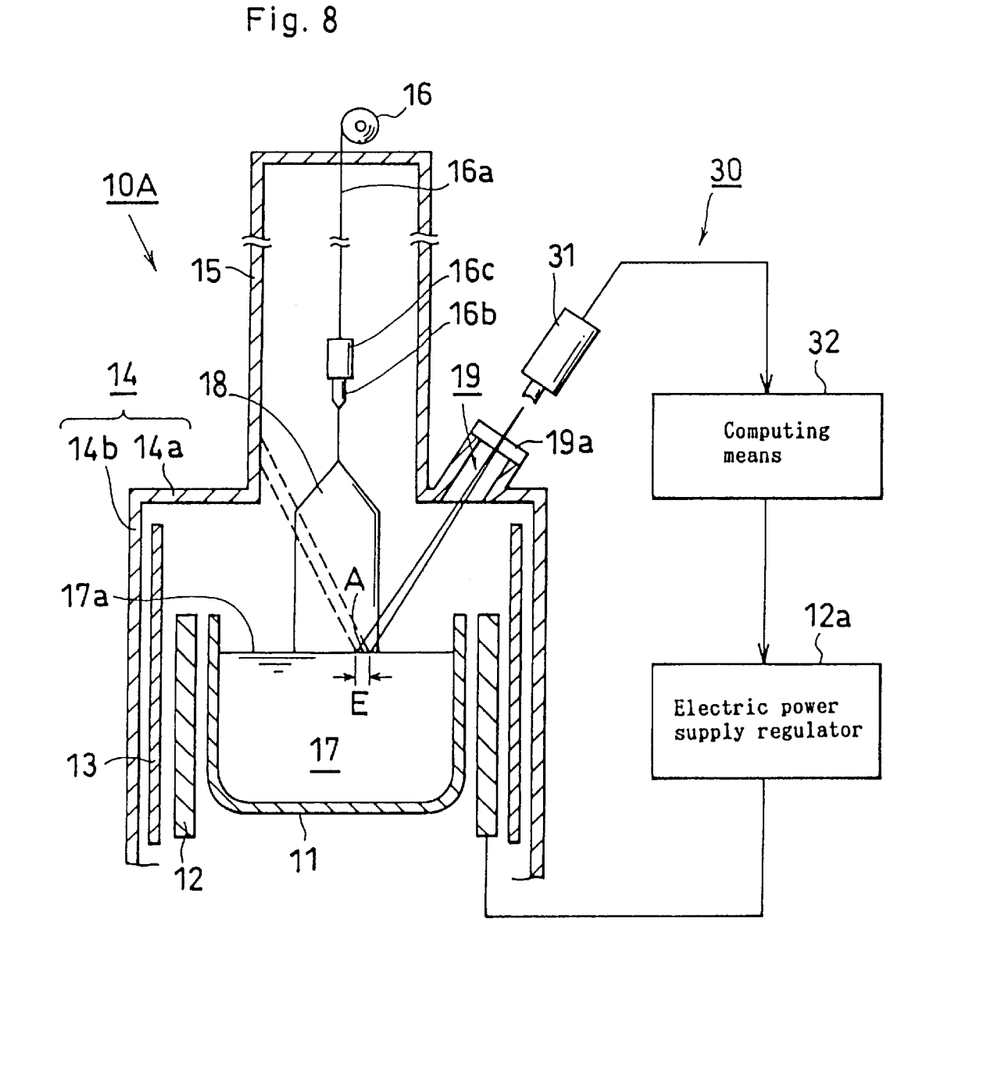
FIG. 8 is a diagrammatic sectional view showing a device used in a method of measuring the temperature of the melt surface within an apparatus for pulling a single crystal (the second process) according to the Embodiment (1)

FIG. 8 is a diagrammatic sectional view showing an apparatus for pulling a single crystal 10A which is used in the second process of the method of measuring the temperature of the melt surface within an apparatus for pulling a single crystal according to the Embodiment (1). The only point different from the apparatus for pulling a single crystal 10 shown in FIG. 7 is that a temperature measuring device 30 is mounted in place of the temperature measuring device 20. A monochromatic radiation thermometer 31 is placed outside the window 19 of the apparatus for pulling a single crystal 10A as a radiation temperature measuring means. The mounting angle of the monochromatic radiation thermometer 31 is selected so that a point A which radiates a radiation light luminance signal $L_{min}$ comes within the relatively narrow visual field E thereof. The monochromatic radiation thermometer 31 is connected to a computing means 32. A temperature measuring device 30 includes the monochromatic radiation thermometer 31 and the computing means 32. The computing means 32 is further connected to the electric power supply regulator 12a, wherein the quantity of electric power supplied to heater 12 is regulated so as to keep the melt surface 17a at a prescribed temperature.

FIG. 9(a) is a flow chart schematically expressing the operation of the computing means 32 in the temperature measuring device 30.

The switch (not shown) of the computing means 32 is turned on to start the operation. In S8, a determination as to whether a radiation light luminance signal $L_{min}$ is output from the monochromatic radiation thermometer 31 or not is made. A determination that is not yet output leads to a return to S8. On the other hand, if a determination is made that the output is started, the temperature $T_S$ of the melt surface 17a is computed based on the radiation light luminance signal $L_{min}$ (S9). The temperature $T_S$ is shown on a display (not shown) and the temperature $T_S$ is transmitted to the electric power supply regulator 12a (S10). In S11, a determination as to whether the switch of the monochromatic radiation thermometer 31 is on or not is made. A determination that the switch is on leads to a return to S8, and the temperature $T_S$ of the melt surface 17a is repeatedly measured. On the other hand, upon determining that the switch is not on, the operation of the computing means 32 is finished.

After detecting the point A which radiates the minimum radiation light luminance signal $L_{min}$ the first process, ordinarily, the temperature of the melt surface 17a is measured only through the second process wherein the temperature measuring device 30 is used. At that time, even if the quantity of the melt 17 decreases as the single crystal 18 is pulled, the vertical position of the crucible 11 is regulated at all times by driving the ascent/descent means so as to keep the radiation point A in almost the same position.

As is obvious from the above descriptions, in the method of measuring the temperature of the melt surface within an apparatus for pulling a single crystal according to the Embodiment (1), even when plural main units of the apparatus for pulling a single crystal 10 are installed, only one unit of the CCD camera 21 and the computing means 22 need be prepared. After computing and detecting the point A on which a stray light component has the smallest influence using the temperature measuring device 20, the surface temperature of the point A can be measured accurately and at low cost using the relatively cheap monochromatic radiation thermometer 31 and the computing means 32. Since modifications and additional equipment to the main unit of the apparatus for pulling a single crystal 10 are not required at all, the cost can be largely reduced.

Since the monochromatic radiation thermometer 31 is used as a radiation temperature measuring means, the cost of the temperature measurement of the melt surface can be further reduced.

Since the CCD camera 21 is used as a temperature distribution measuring means, the surface temperature distribution can be measured by a simple operation.

The method for measuring the temperature of the melt surface within an apparatus for pulling a single crystal according to Embodiment (2) is described below. Since an apparatus used for the method for measuring the temperature of the melt surface within an apparatus for pulling a single crystal according to the Embodiment (2) is the same as one shown in FIG. 7. except for a computing means 26, the method according to the Embodiment (2) is described by reference to FIG. 7.

Reference numeral 21 in the figure represents a CCD camera, and the CCD camera 21 is connected to a computing means 26 which is connected to an electric power supply regulator 12a. A temperature measuring device 25 includes the CCD camera 21 and the computing means 26. Since the other constituents are the same as those of the apparatus described in the Embodiment (1), detailed descriptions thereof are omitted here.

Figure 10:
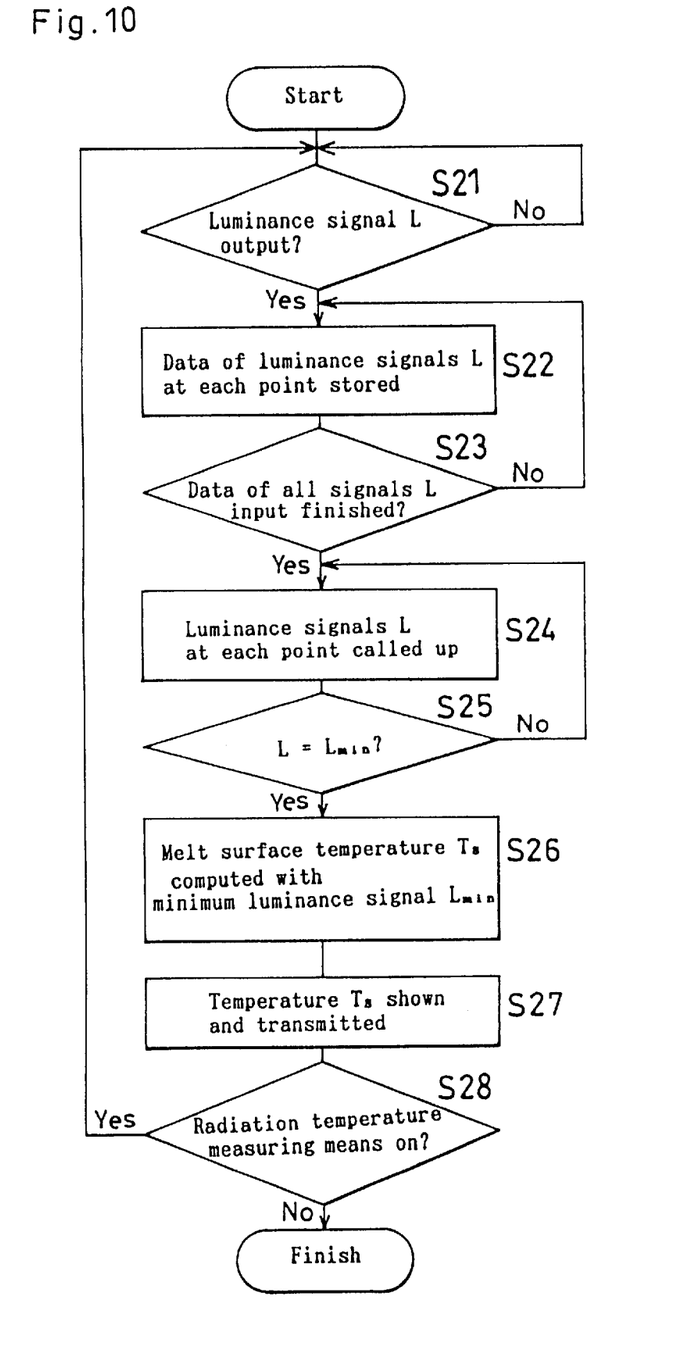
FIG. 10 comprises flow charts schematically expressing the operation of a temperature measuring device of the melt surface within an apparatus for pulling a single crystal according to the Embodiment (2).

FIG. 10 is a flow chart schematically expressing the operation of the computing means 26 in the temperature measuring device 25. Since S21–S25 in FIG. 10 are the same as S1–S5 of the flow chart shown in FIG. 9(a), the descriptions of S21–S25 are omitted here.

In S25, when a radiation light luminance signal L is determined as being the minimum radiation light luminance signal. $L_{min}$, the temperature $T_S$ of the melt surface 17a is computed based on the radiation light luminance signal $L_{min}$ (S26). The temperature $T_S$ is shown on a display (not shown) and the temperature $T_S$ signal is transmitted to the electric power supply regulator 12a (S27). In S28, a determination as to whether the switch of the CCD camera 21 is on or not is made. A determination that the switch is on leads to a return to S21, and the temperature $T_S$ of the melt surface 17a is continuously computed. On the other hand, upon determining that the switch is not on, the operation of the computing means 26 is finished.

As is obvious from the above descriptions, in the method for measuring the temperature of the melt surface within an apparatus for pulling a single crystal according to the Embodiment (2), even if the operation conditions substantially vary during the pulling of a single crystal 18, a point A on which a stray light component has the smallest influence can be accurately found using the CCD camera 21 and the computing means 26, and the surface temperature of the point A can be accurately measured at all times. Since modifications and additional equipment to the main unit of the apparatus for pulling a single crystal 10A are not required at all, an increase in cost is not caused.

Since the CCD camera 21 is used as a temperature distribution measuring means, the surface temperature distribution can be accurately measured by a simple operation.

In the temperature measuring device 25 according to the Embodiment (2), it is not necessary to use the temperature distribution measuring means in combination with another radiation thermometer. As a result, the operation is extremely simple, so that the measurement precision can certainly be improved.

In the methods for measuring the temperature of the melt surface within an apparatus for pulling a single crystal according to the Embodiments (1) and (2). the cases wherein the CCD camera 21 is used as a temperature distribution measuring means constituting the temperature measuring device 20 or 25 are described, but the temperature distribution measuring means is not limited to the CCD camera 21. In another embodiment, a thermal image measuring device may be used as a temperature distribution measuring means. In this case, the surface temperature can be more accurately measured.

EXAMPLES

The results of the temperature measurement of the melt surface within an apparatus for pulling a single crystal by the methods according to the embodiments of the present invention are described below.

Example 1

A temperature measuring method according to the Embodiment (1) was adopted. A monochromatic radiation thermometer 31 having a visual field E of about 2 mm was used. The mounting angle (angle of incidence) thereof was set to about 20°. A point A on which a stray light component had the smallest influence was set in position about 75 mm sideward and about 90 mm forward from the center of a crucible 11, and the temperature $T_S$ of the melt surface 17a was measured. When the range of the variation of the distance between the point A and the monochromatic radiation thermometer 31 was within ±5 mm, the measurement error in the temperature $T_S$ could be reduced to about 30° C. and less.

Example 2

A temperature measuring method according to the Embodiment (2) was adopted. Using a CCD camera 21 whose mounting angle (angle of incidence) was set to about 20°, the temperature $T_S$ of the melt surface 17a was measured. As a result, a point A on which a stray light component had the smallest influence was detected in the position about 75 mm sideward and about 90 mm forward from the center of a crucible 11. The mean number of times of reflection n of the stray lights reaching the point A was 3, and the measurement error in the temperature $T_S$ could be reduced to about 30° C. or less at all times.

What is claimed is:

1. A method of measuring a melt surface temperature within an apparatus for pulling a single crystal, comprising:
  measuring a luminance distribution of radiation light radiated from the melt surface within the apparatus by using a temperature distribution measuring device so as to compile radiation light luminance distribution data;
  determining a location of a point on the melt surface having a minimum radiation light luminance by using a computing device and the radiation light luminance distribution data; and measuring the melt surface temperature at the point on the melt surface having the minimum radiation light luminance by using a radiation temperature measuring device.

2. The method of claim 1, wherein the radiation light luminance distribution data includes locations of a plurality of points on the melt surface detected by the temperature distribution measuring device, said determining of the location of the point on the melt surface having a minimum radiation light luminance comprises computing the radiation light luminance distribution data so as to ascertain one of said plurality of points on the melt surface having a minimum radiation light luminance.

3. The method of claim 1, wherein the radiation temperature measuring device comprises a monochromatic radiation thermometer.

4. The method of claim 3, wherein the temperature distribution measuring device comprises a CCD camera.

5. The method of claim 3, wherein the temperature distribution measuring device comprises a thermal image measuring device.

6. The method of claim 1, wherein the temperature distribution measuring device comprises a CCD camera.

7. The method of claim 1, wherein the temperature distribution measuring device comprises a thermal image measuring device.

8. A method of measuring a melt surface temperature within an apparatus for pulling a single crystal, comprising:

measuring a luminance distribution of radiation light radiated from the melt surface within the apparatus by using a temperature distribution measuring device so as to compile radiation light luminance distribution data; and obtaining the melt surface temperature at a point calculated as having a minimum radiation light luminance using a computing device and the radiation light luminance distribution data.

9. The method of claim 8, wherein the temperature distribution measuring device comprises a CCD camera.

10. The method of claim 8, wherein the temperature distribution measuring device comprises a thermal image measuring device.

\* \* \* \* \*